United States Patent
Park et al.

(10) Patent No.: US 10,095,103 B2
(45) Date of Patent: Oct. 9, 2018

(54) PHOTOMASK AND METHOD OF FORMING FINE PATTERN USING THE SAME

(71) Applicant: Samsung Display Co. Ltd., Yongin, Gyeonggi-Do (KR)

(72) Inventors: Kwang Woo Park, Hwaseong-si (KR); Jun Hyuk Woo, Seongnam-si (KR); Jeong Won Kim, Seoul (KR); Seung Bo Shim, Asan-si (KR); Jin Ho Ju, Seoul (KR)

(73) Assignee: Samsung Display Co., Ltd. (KR)

( * ) Notice: Subject to any disclaimer, the term of this patent is extended or adjusted under 35 U.S.C. 154(b) by 285 days.

(21) Appl. No.: 14/671,822

(22) Filed: Mar. 27, 2015

(65) Prior Publication Data

US 2016/0170295 A1    Jun. 16, 2016

(30) Foreign Application Priority Data

Dec. 15, 2014    (KR) ........................ 10-2014-0180095

(51) Int. Cl.
| | |
|---|---|
| *G03F 1/52* | (2012.01) |
| *G02B 5/20* | (2006.01) |
| *G03F 1/54* | (2012.01) |
| *G03F 7/20* | (2006.01) |

(52) U.S. Cl.
CPC ................ *G03F 1/54* (2013.01); *G03F 7/203* (2013.01); *G03F 7/2024* (2013.01)

(58) Field of Classification Search
CPC ......... G03F 1/52; G03F 7/70191; G02B 5/20; G02B 5/22; G02B 5/203
See application file for complete search history.

(56) References Cited

U.S. PATENT DOCUMENTS

2003/0156236 A1* 8/2003 Yamada .............. G02F 1/13394
    349/106
2012/0308919 A1* 12/2012 Chen ..................... G02B 5/201
    430/5

FOREIGN PATENT DOCUMENTS

| JP | 2002-258462 | 9/2002 |
|---|---|---|
| KR | 10-2012-0081656 | 7/2012 |
| KR | 10-2013-0028172 | 3/2013 |
| KR | 10-2013-0028178 | 3/2013 |
| KR | 10-2014-0015060 | 2/2014 |
| KR | 10-2014-0036929 | 3/2014 |

\* cited by examiner

*Primary Examiner* — Christopher G Young
(74) *Attorney, Agent, or Firm* — Innovation Counsel LLP

(57) ABSTRACT

A photomask is provided. A photomask, comprising: a transparent substrate; and a plurality of filter layers disposed on the transparent substrate, wherein the filter layers include a first filter layer, which selectively transmits first-wavelength light therethrough, and a second filter layer, which selectively transmits second-wavelength light therethrough.

18 Claims, 12 Drawing Sheets

PHOTOMASK AND METHOD OF FORMING FINE PATTERN USING THE SAME

This application claims priority to Korean Patent Application No. 10-2014-0180095 filed on Dec. 15, 2014 in the Korean Intellectual Property Office, the disclosure of which is incorporated herein by reference in its entirety.

BACKGROUND

1. Field

The inventive concept relates to a photomask and a method of forming a fine pattern using the same.

2. Description of the Related Art

As the integration density of display devices increases, techniques for forming a fine pattern have increasingly become of great importance and photolithography technology for forming circuit patterns for display devices has been rapidly developing.

Photolithography may involve forming photoresist whose solubility in a developing solution varies by irradiating light from a light source on a glass substrate where a circuit metal layer is formed, exposing the photoresist to light by using a photomask, and removing part of the photoresist that is highly soluble in the developing solution so as to form a photosensitive layer pattern. By using the photosensitive layer pattern, part of the metal layer around the photosensitive layer pattern is selectively removed through dry or wet etching, thereby forming a circuit pattern.

Conventional photolithography technique uses a single photomask to form a single pattern layer. Accordingly, as many photomasks as layers to be patterned may be needed during the fabrication of a thin-film circuit through photolithography.

SUMMARY

Exemplary embodiments of the inventive concept provide a photomask capable of forming different patterns depending on the wavelength of light.

Exemplary embodiments of the inventive concept also provide a method of forming a fine pattern using a single photomask capable of forming different patterns.

However, exemplary embodiments of the inventive concept are not restricted to those set forth herein. The above and other exemplary embodiments of the inventive concept will become more apparent to one of ordinary skill in the art to which the inventive concept pertains by referencing the detailed description of the inventive concept given below.

According to an aspect of the present inventive concept, there is provided a photomask, comprising: a transparent substrate; and a plurality of filter layers disposed on the transparent substrate, wherein the filter layers include a first filter layer, which selectively transmits first-wavelength light therethrough, and a second filter layer, which selectively transmits second-wavelength light therethrough.

Part of the second filter layer overlaps the entire first filter layer.

The first filter layer has a different shape from the second filter layer.

The first filter layer includes first and second sub-filter layers, which are disposed on the transparent substrate to be separate from each other, and the second filter layer overlaps at least one of the first and second sub-filter layers.

Part of the second filter layer overlaps the entire first sub-filter layer and the entire second sub-filter layer.

The second filter layer includes third and fourth sub-filter layers, which are disposed on the transparent substrate to be separate from each other, the third sub-filter layer overlaps at least one of the first and second sub-filter layers and the fourth sub-filter layer overlaps at least one of the first and second sub-filter layers.

The first and second sub-filter layers have the same shape.

The second filter layer has a different shape from at least one of the first and second sub-filter layers.

According to another aspect of the present inventive concept, there is provided a method of forming a fine pattern, the method comprising: forming a resist layer by applying photoresist onto a first substrate; placing a photomask over the resist layer; and forming a resist pattern by exposing the resist layer to light through the photomask with the use of an exposure device, which generates light of a predetermined wavelength, and developing the resist layer, wherein the photomask includes a second substrate and a plurality of filter layers disposed on the second substrate, the filter layers include a first filter layer, which selectively transmits first-wavelength light therethrough, and a second filter layer, which selectively transmits second-wavelength light therethrough.

The forming the resist pattern, comprises: allowing the exposure device to generate the first-wavelength light and exposing the resist layer to the generated first-wavelength light through the photomask; and allowing the exposure device to generate the second-wavelength light and exposing the resist layer to the generated second-wavelength light through the photomask.

The method further includes, before the forming the resist layer, forming a layer to be etched on the first substrate, wherein the resist layer is formed on the layer to be etched.

The method further includes forming a fine pattern by partially etching the layer to be etched with the use of the resist pattern.

The method further includes removing the resist pattern.

The second filter layer overlaps the entire first filter layer.

The first filter layer has a different shape from the second filter layer.

The first filter layer includes first and second sub-filter layers, which are disposed on the second substrate to be separate from each other, and the second filter layer overlaps at least one of the first and second sub-filter layers.

Part of the second filter layer overlaps the entire first sub-filter layer and the entire second sub-filter layer.

The first and second sub-filter layers have the same shape.

The second filter layer has a different shape from at least one of the first and second sub-filter layers.

The second filter layer includes third and fourth sub-filter layers, which are disposed on the second substrate to be separate from each other, the third sub-filter layer overlaps at least one of the first and second sub-filter layers and the fourth sub-filter layer overlaps at least one of the first and second sub-filter layers.

According to the exemplary embodiments, it is possible to provide a photomask capable of forming different patterns depending on the wavelength of light.

In addition, it is possible to form different patterns by using a single mask.

Moreover, it is possible to reduce the amount of time that it takes a pattern.

Other features and exemplary embodiments will be apparent from the following detailed description, the drawings, and the claims.

DETAILED DESCRIPTION OF THE EMBODIMENTS

Figure 1:
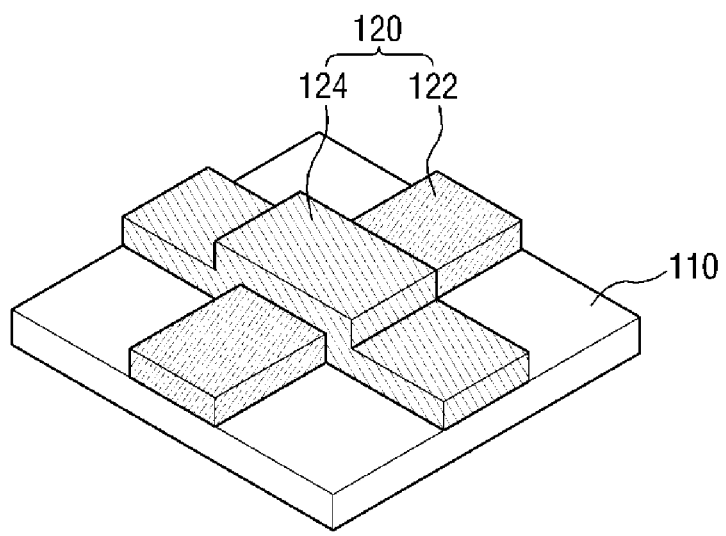
FIG. 1 is a perspective view of a photomask according to an exemplary embodiment of the inventive concept.

Reference will now be made in detail to exemplary embodiments, examples of which are illustrated in the accompanying drawings, wherein like reference numerals refer to like elements throughout the specification. In this regard, the present exemplary embodiments may have different forms and should not be construed as being limited to the descriptions set forth herein. Accordingly, the exemplary embodiments are merely described below, by referring to the figures, to explain aspects of the present description.

The description that one element is connected to or coupled to another element includes both a case where the one element is directly connected to the another element or a case where further another element is interposed between the elements. However, the description that one element is directly connected or directly coupled to another element indicates that there is no further another element between the elements. The term "and/or" includes any and all combinations of one or more of the associated listed items.

A singular expression in the present specification also includes a plural expression. The terms "comprise" and/or "comprising" do not exclude the possibility of existence or addition of one or more other components, steps, operations, and/or devices.

Exemplary embodiments will hereinafter be described with reference to the accompanying drawings.

Figure 2:
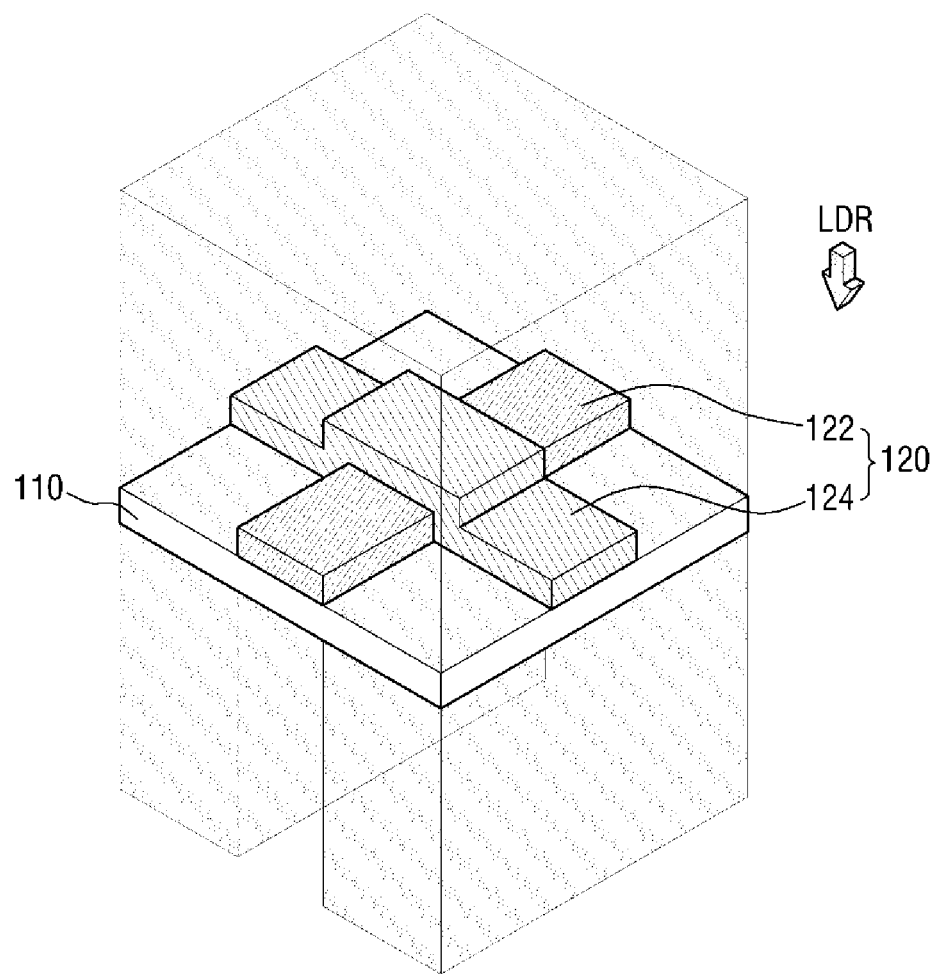
FIG. 2 is a perspective view illustrating transmitted light obtained by transmitting second-wavelength light through the photomask of FIG. 1.
Figure 3:
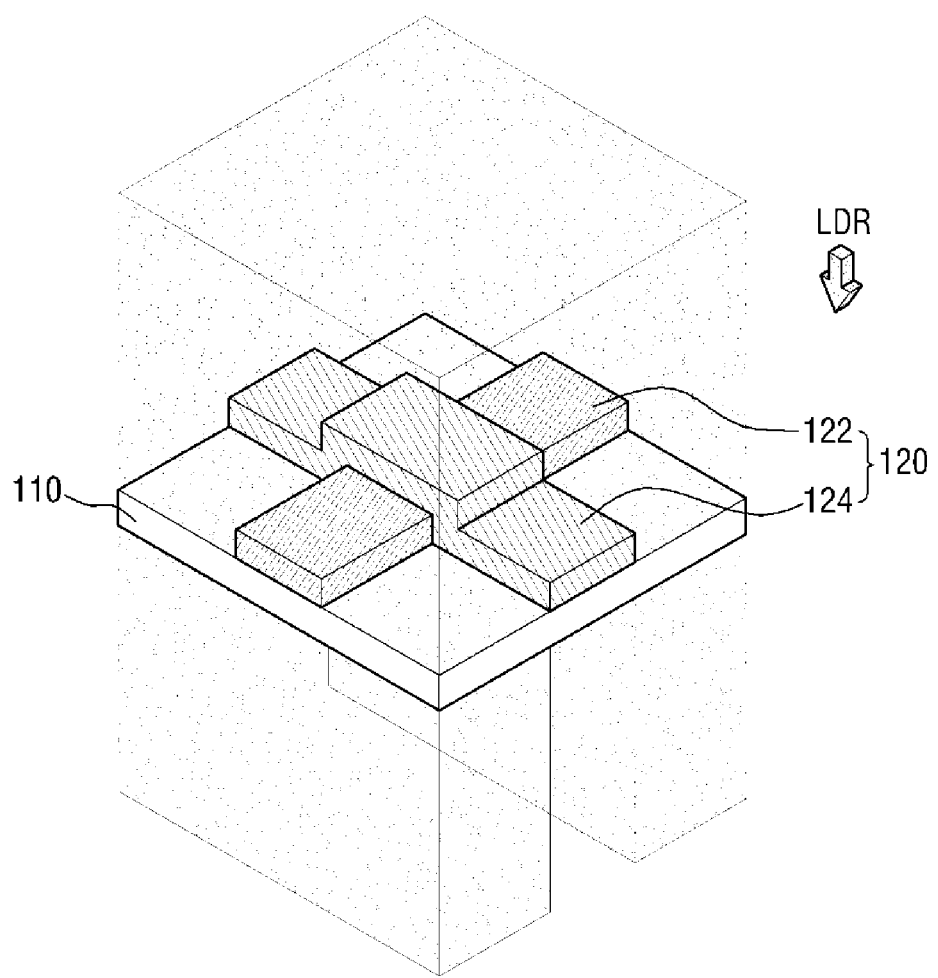
FIG. 3 is a perspective view illustrating transmitted light obtained by transmitting first-wavelength light through the photomask of FIG. 1.

FIG. 1 is a perspective view of a photomask according to an exemplary embodiment of the inventive concept. FIG. 2 is a perspective view illustrating transmitted light obtained by transmitting second-wavelength light through the photomask of FIG. 1. FIG. 3 is a perspective view illustrating transmitted light obtained by transmitting first-wavelength light through the photomask of FIG. 1.

Referring to FIG. 1, a photomask 100 may include a transparent substrate 110 and a plurality of filter layers 120.

The transparent substrate 110 may be transparent enough to transmit light L therethrough, and may have a rectangular shape, as illustrated in FIG. 1. However, the shape of the transparent substrate 110 is not limited to a rectangular shape.

The transparent substrate 110 may include quartz glass. The quartz glass may be more efficient for transmitting light used for photolithography than the other glass such as a general soda line glass that does not contain quartz.

The filter layers 120, which selectively transmit light with a predetermined wavelength therethrough, may be disposed on one surface of the transparent substrate 110.

In exemplary embodiments, the filter layers 120 may include a first filter layer 122 and a second filter layer 124, as illustrated in FIG. 1. The first filter layer 122 and the second filter layer 124 may at least partially overlap each other.

More specifically, as illustrated in FIG. 1, the first filter layer 122 may be disposed on the transparent substrate 110 to extend in a first direction, and the second filter layer 124 may be disposed on the transparent substrate 110 to extend in a direction perpendicular to the first direction. The second filter layer 124 may partially overlap the first filter layer 122 at a central part of the transparent substrate 110. That is, the second filter layer 124 may be formed to cover part of the first filter layer 122. Also, the second filter layer 124 may be formed to continuously extend while covering part of the first filter layer 122, but the inventive concept is not limited thereto. That is, the second filter layer 124 may be formed such that a portion of the second filter layer 124 on the first filter layer 122 and portions of the second filter layer 124 on the transparent substrate 110 may be disconnected from each other.

In the exemplary embodiment of FIG. 1, the filter layers 120 include two filter layers, but the inventive concept is not limited thereto. That is, the filter layers 120 may include more than two filter layers. Also, the shapes of the filter layers 120 are not limited to the shapes of the first and second filter layers 122 and 124 illustrated in FIG. 1. That is, the filter layers 120 may be formed in various shapes according to the shape of a pattern to be formed.

The first filter layer 122 may selectively transmit first-wavelength light therethrough but block light having the other wavelength, and the second filter layer 124 may selectively transmit second-wavelength light therethrough but block light having the other wavelength. The first-wavelength light and the second-wavelength light may have different wavelengths from each other. Accordingly, the photomask 100 may selectively transmit incident light therethrough depending on the wavelength of the incident light.

FIG. 2 is a perspective view illustrating transmitted light obtained by transmitting second-wavelength light through the photomask of FIG. 1. FIG. 3 is a perspective view illustrating transmitted light obtained by transmitting first-wavelength light through the photomask of FIG. 1.

Referring to FIG. 2, in response to second-wavelength light being incident upon the photomask 100 in a direction LDR, the second-wavelength light may be blocked by the photomask 100 in an area on the transparent substrate 110 where the first filter layer 122 is disposed, and may be transmitted through by the photomask 100 in an area on the transparent substrate 110 where the second filter layer 124 is disposed. The second-wavelength light may be blocked by the first filter layer 122 in the overlapping area of the first and second filter layers 122 and 124.

Referring to FIG. 3, in response to first-wavelength light being incident upon the photomask 100 in the direction LDR, the first-wavelength light may be transmitted through by the photomask 100 in the area where the first filter layer 122 is disposed, and may be blocked by the photomask 100 in the area where the second filter layer 124 is disposed. The first-wavelength light may be blocked by the second filter layer 124 in the overlapping area of the first and second filter layers 122 and 124.

In exemplary embodiments, the first filter layer 122, which selectively transmits the first-wavelength light therethrough, and the second filter layer 124, which selectively transmits the second-wavelength light therethrough, may be laminated on the transparent substrate, but the inventive concept is not limited thereto. That is, at least one of the filter layers 120 transmitting light having predetermined wavelength may be formed as having more than one separate segment and may be disposed on the transparent substrate 110. That is, at least one of the first and second filter layers 122 and 124 may be formed to include a plurality of sub-filter layers.

Figure 4:
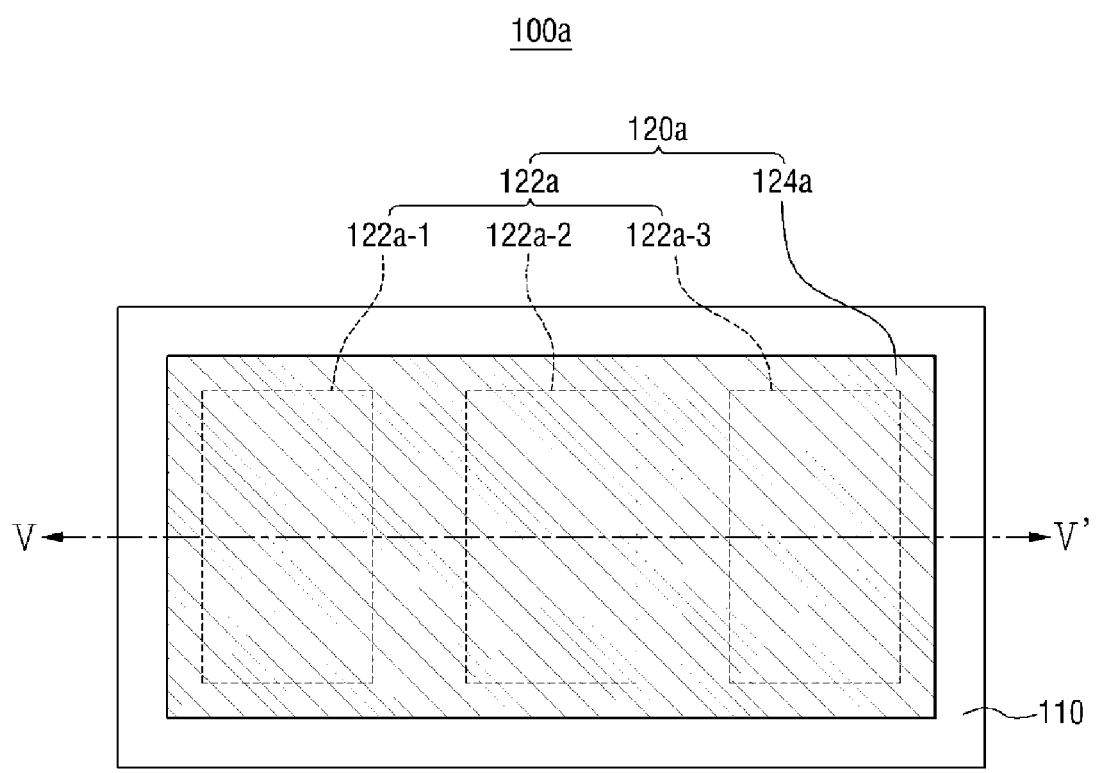
FIG. 4 is a plan view of a photomask according to another exemplary embodiment of the inventive concept.
Figure 5:
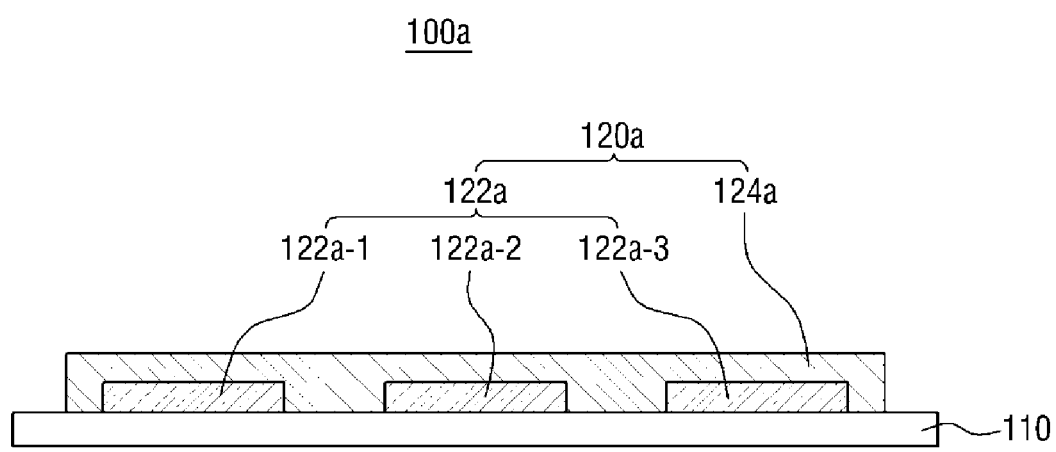
FIG. 5 is a cross-sectional view taken along line V-V' of FIG. 4.

FIG. 4 is a plan view of a photomask according to another exemplary embodiment of the inventive concept. FIG. 5 is a cross-sectional view taken along line V-V' of FIG. 4.

Referring to FIGS. 4 and 5, a photomask 100*a* is identical, or similar, to the photomask 100 of FIG. 1 except for the structure of a plurality of filter layers 120*a*, and thus will hereinafter be described, focusing mainly on differences with the photomask 100 of FIG. 1.

The filter layers 120*a* may include a first filter layer 122*a* and a second filter layer 124*a*. The first filter layer 122*a* may include a first sub-filter layer 122*a*-1, a second sub-filter layer 122*a*-2 and a third sub-filter layer 122*a*-3, as illustrated in FIGS. 4 and 5. That is, the first filter layer 122*a* may include a plurality of first, second and third sub-filter layers 122*a*-1, 122*a*-2 and 122*a*-3, which are formed on a transparent substrate 110 as separate layers.

Each of the first, second and third sub-filter layers 122*a*-1, 122*a*-2 and 122*a*-3 may transmit first-wavelength light, and the second filter layer 124*a* may transmit second-wavelength light.

Part of the second filter layer 124*a* may overlap the entire first filter layer 122*a*. That is, part of the second filter layer 124*a* may overlap all of the first, second and third sub-filter layers 122*a*-1, 122*a*-2 and 122*a*-3. The second filter layer 124*a* is illustrated in FIGS. 4 and 5 as being disposed on each of the first, second and third sub-filter layers 122*a*-1, 122*a*-2 and 122*a*-3, but the inventive concept is not limited thereto. That is, the first, second and third sub-filter layers 122*a*-1, 122*a*-2 and 122*a*-3 may be disposed on the second filter layer 124*a*.

The first, second and third sub-filter layers 122*a*-1, 122*a*-2 and 122*a*-3 may be formed in a rectangular shape in a plan view, as illustrated in FIG. 4, but the inventive concept is not limited thereto. The first, second and third sub-filter layers 122*a*-1, 122*a*-2 and 122*a*-3 may be formed in different shapes from one another.

In the exemplary embodiment of FIGS. 4 and 5, the first filter layer 122*a* may be formed to include a plurality of sub-filter layers (i.e., the first, second and third sub-filter layers 122*a*-1, 122*a*-2 and 122*a*-3), which are disposed on the transparent substrate 110 to be separate from one another, and the second filter layer 124*a* may be formed as a one-piece layer. Alternatively, the second filter layer 124*a* may be formed to include a plurality of sub-filter layers, which are disposed on the transparent substrate 110 to be separate from one another, and the first filter layer 122*a* may be formed as a one-piece layer. Alternatively, not only the first filter layer 122*a*, but also the second filter layer 124*a*, may be formed to include a plurality of sub-filter layers, which are disposed on the transparent substrate 110 to be separate from one another.

In the exemplary embodiments of FIGS. 1 to 5, the filter layers 120 or 120*a* may include the first filter layer 122 or 122*a*, which selectively transmits first-wavelength light therethrough and blocks second-wavelength light, and the second filter layer 124 or 124*a*, which selectively transmits second-wavelength light therethrough and blocks first-wavelength light, but the inventive concept is not limited thereto. That is, the filter layers 120 or 120*a* may be formed to further include a filter layer, which selectively transmits another-wavelength light therethrough.

Figure 6:
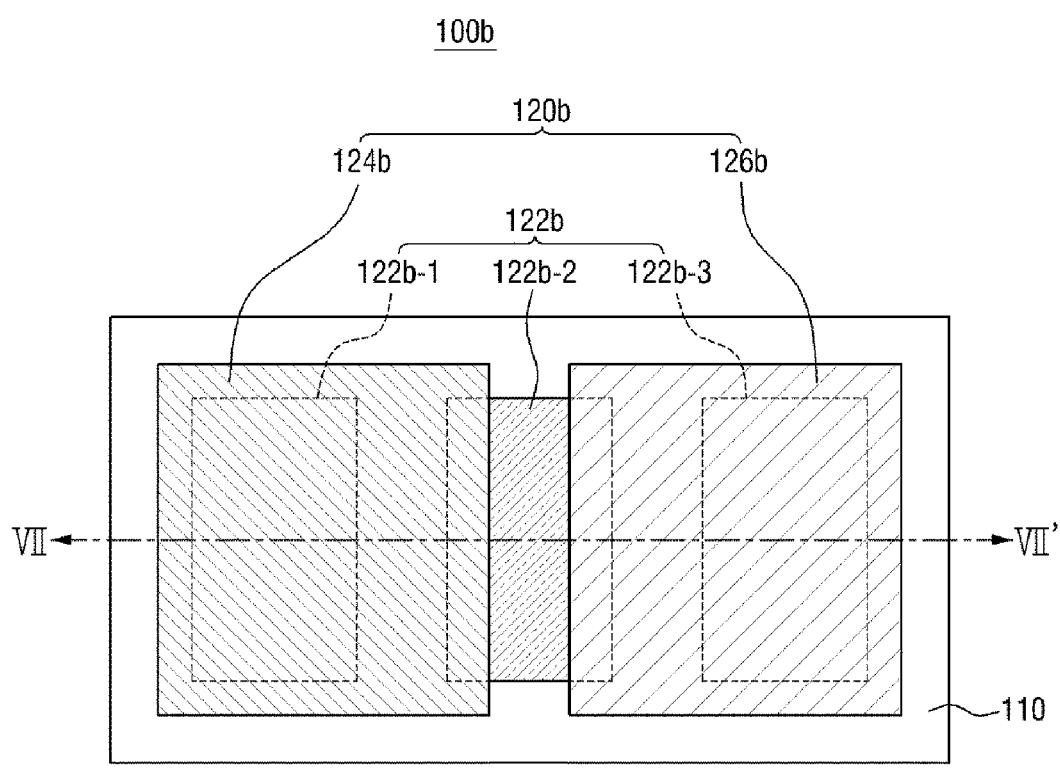
FIG. 6 is a plan view of a photomask according to another exemplary embodiment of the inventive concept.
Figure 7:
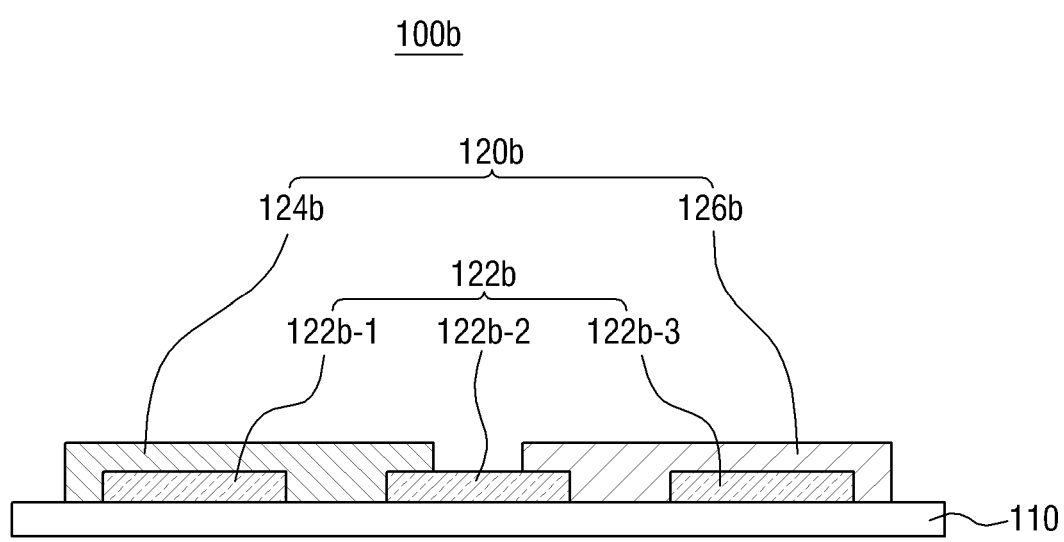
FIG. 7 is a cross-sectional view taken along line VII-VII' of FIG. 6.

FIG. 6 is a plan view of a photomask according to another exemplary embodiment of the inventive concept. FIG. 7 is a cross-sectional view taken along line VII-VII' of FIG. 6.

Referring to FIGS. 6 and 7, a photomask 100*b* is identical, or similar, to the photomask 100 of FIG. 1 except for the structure of a plurality of filter layers 120*b*, and thus will hereinafter be described, focusing mainly on differences with the photomask 100 of FIG. 1.

The filter layers 120*b* may include a first filter layer 122*b*, a second filter layer 124*b* and a third filter layer 126*b*. The first filter layer 122*b* may include a first sub-filter layer 122*b*-1, a second sub-filter layer 122*b*-2 and a third sub-filter layer 122*b*-3, as illustrated in FIGS. 6 and 7.

Each of the first, second and third sub-filter layers 122*b*-1, 122*b*-2 and 122*b*-3, which are included in the first filter layer 122*b*, may selectively transmit first-wavelength light therethrough but block the second-wavelength light and the third-wavelength light, the second filter layer 124*b* may selectively transmit second-wavelength light therethrough but block the first-wavelength light and the third-wavelength light, and the third filter layer 126*b* may selectively transmit third-wavelength light therethrough but block the first-wavelength light and the second-wavelength light. The first-wavelength light, second-wavelength light and third-wavelength light may be of different wavelengths from one another.

Part of the second filter layer 124*b* may overlap part of the first filter layer 122*b*, and part of the third filter layer 126*b* may overlap part of the first filter layer 122*b*. More specifically, the second filter layer 124*b* may overlap the entire first sub-filter layer 122*b*-1 and part of the second sub-filter layer 122*b*-2, and the third filter layer 126*b* may overlap part of the second sub-filter layer 122*b*-2 and the entire third sub-filter layer 122*b*-3.

The second filter layer 124*b* may be disposed on the first and second sub-filter layers 122*b*-1 and 122*b*-2, and the third filter layer 126*b* may be disposed on the second and third sub-filter layers 122*b*-2 and 122*b*-3. However, the inventive concept is not limited to the exemplary embodiment of FIGS. 6 and 7. That is, the first and second sub-filter layers 122*b*-1 and 122*b*-2 may be disposed on the second filter layer 124*b*, and the second and third sub-filter layers 122*b*-2 and 122*b*-3 may be disposed on the third filter layer 126*b*.

The second and third sub-filter layers 122*b*-2 and 122*b*-3 may be formed in a rectangular shape in a plan view, as illustrated in FIG. 6, but the inventive concept is not limited thereto.

Referring back to FIGS. 1 to 3, second-wavelength light incident upon the photomask 100 in the direction LDR may be transmitted through by the photomask 100, as illustrated in FIG. 2, and first-wavelength light incident upon the photomask 100 in the direction LDR may be transmitted through by the photomask 100, as illustrated in FIG. 3. Alternatively, the structure and arrangement of the filter layers 120 may be varied so as for the photomask 100 to selectively transmit the first-wavelength light therethrough, as illustrated in FIG. 2, and to selectively transmit the second-wavelength light therethrough, as illustrated in FIG. 3.

Figure 8:
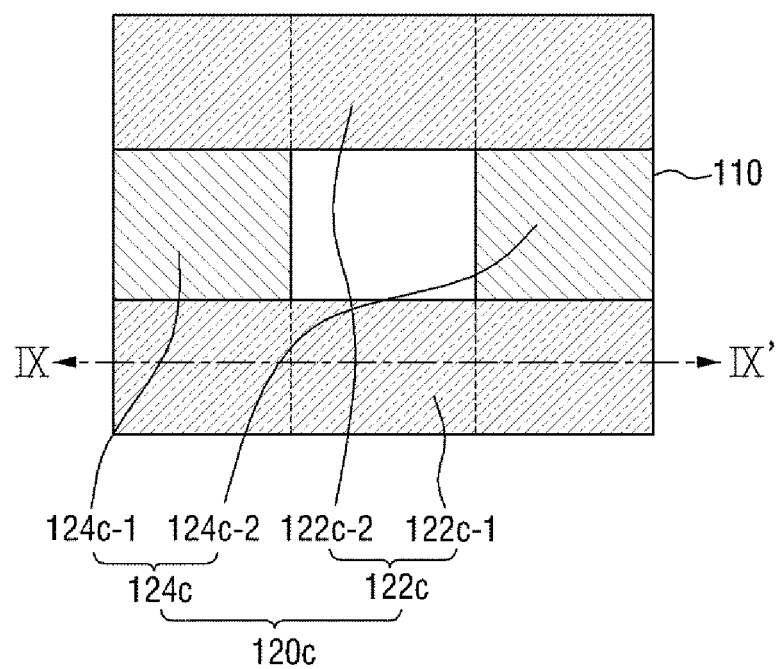
FIG. 8 is a plan view of a photomask according to another exemplary embodiment of the inventive concept.
Figure 9:
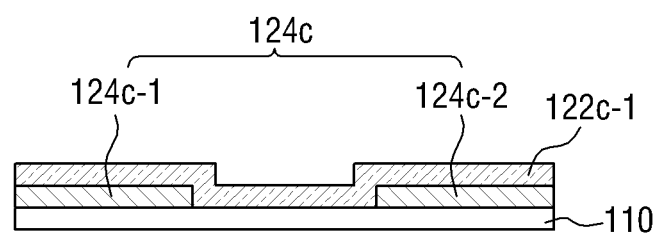
FIG. 9 is a cross-sectional view taken along line IX-IX' of FIG. 8.

FIG. 8 is a plan view of a photomask according to another exemplary embodiment of the inventive concept. FIG. 9 is a cross-sectional view taken along line IX-IX' of FIG. 8.

Referring to FIGS. 8 and 9, a photomask 100c is identical, or similar, to the photomask 100 of FIG. 1 except for the structure of a plurality of filter layers 120c, and thus will hereinafter be described, focusing mainly on differences with the photomask 100 of FIG. 1.

As illustrated in FIGS. 8 and 9, the filter layers 120c may include a first filter layer 122c and a second filter layer 124c. The first filter layer 122c may include a first sub-filter layer 122c-1 and a second sub-filter layer 122c-2, and the second filter layer 124c may include a third sub-filter layer 124c-1 and a fourth sub-filter layer 124c-2.

More specifically, the first sub-filter layer 122c-1 and the second sub-filter layer 122c-2 may be disposed above a transparent substrate 110 on the third sub-filter layer 124c-1 and the fourth sub-filter layer 124c-2. The third sub-filter layer 124c-1 may be disposed on a left side of the transparent substrate 110, and the fourth sub-filter layer 124c-2 may be disposed on a right side of the transparent substrate 110.

A first end portion of the first sub-filter layer 122c-1 may overlap a first end portion of the third sub-filter layer 124c-1, and a second end portion of the first sub-filter layer 122c-1 may overlap a first end portion of the fourth sub-filter layer 124c-2.

A first end portion of the second sub-filter layer 122c-2 may overlap a second end portion of the third sub-filter layer 124c-1, and a second end portion of the second sub-filter layer 122c-2 may overlap a second end portion of the fourth sub-filter layer 124c-2.

The first and second sub-filter layers 122c-1 and 122c-2 may selectively transmit first-wavelength light therethrough but block second-wavelength light, and the third and fourth sub-filter layers 124c-1 and 124c-2 may selectively transmit second-wavelength light therethrough but block first-wavelength light. The first-wavelength light and the second-wavelength light may be of different wavelengths from each other.

In response to the first-wavelength light being incident upon the photomask 100c in one direction, the first-wavelength light may be selectively transmitted through by the photomask 100c, as illustrated in FIG. 3. In response to the second-wavelength light being incident upon the photomask 100c in one direction, the second-wavelength light may be selectively transmitted through by the photomask 100c, as illustrated in FIG. 2.

That is, the filter layers 120c of the photomask 100c may have a different structure from the filter layers 120 of the photomask 100 of FIGS. 1 to 3, but may be used to form the same pattern as, or a similar pattern to, the filter layers 120 of the photomask 100 of FIGS. 1 to 3.

A method of forming a fine pattern, according to an exemplary embodiment of the inventive concept, will hereinafter be described. In the description that follows, it is assumed that the photomask 100a of FIGS. 4 and 5 is used, but the inventive concept is not limited thereto. That is, the inventive concept is also applicable to a case when the photomask 100 of FIGS. 1 to 3, the photomask 100b of FIGS. 6 and 7 or the photomask 100c of FIGS. 8 and 9 is used.

By using the method of forming a fine pattern, according to an exemplary embodiment of the inventive concept, it is possible to form a fine pattern, such as wiring, an electrode or a contact hole, on a substrate. That is, by using the method of forming a fine pattern, according to an exemplary embodiment of the inventive concept, it is possible to fabricate an integrated circuit (IC), a thin-film circuit or a wiring pattern comprising a fine pattern on a semiconductor substrate.

FIGS. 10 to 16 are cross-sectional views illustrating a method of forming a fine pattern, according to an exemplary embodiment of the inventive concept.

Figure 10:
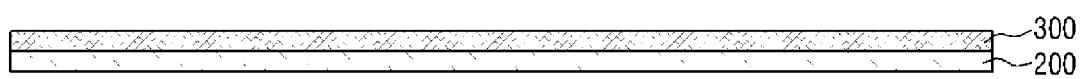
FIGS. 10, 11, 12, 13, 14, 15 and 16 are cross-sectional views illustrating a method of forming a fine pattern, according to an exemplary embodiment of the inventive concept.

Referring to FIG. 10, a layer 300 to be etched may be formed on a substrate 200. The layer 300 may include a semiconductor material layer, an insulating layer or a conductive layer.

Figure 11:
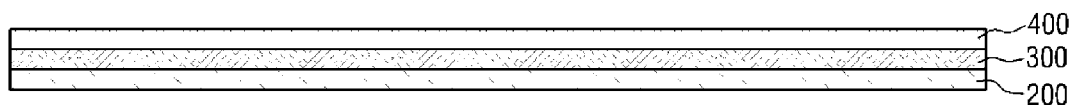

Thereafter, referring to FIG. 11, a resist layer 400 may be formed by applying photoresist onto the layer 300. The resist layer 400 may be formed by spin coating, spraying or dipping. The photoresist may be positive photoresist or negative photoresist.

In exemplary embodiments, the layer 300 and the resist layer 400 may be sequentially formed on the substrate 200, as illustrated in FIGS. 10 and 11, but the inventive concept is not limited thereto. That is, the resist layer 400 may be directly formed on the substrate 200.

Figure 12:
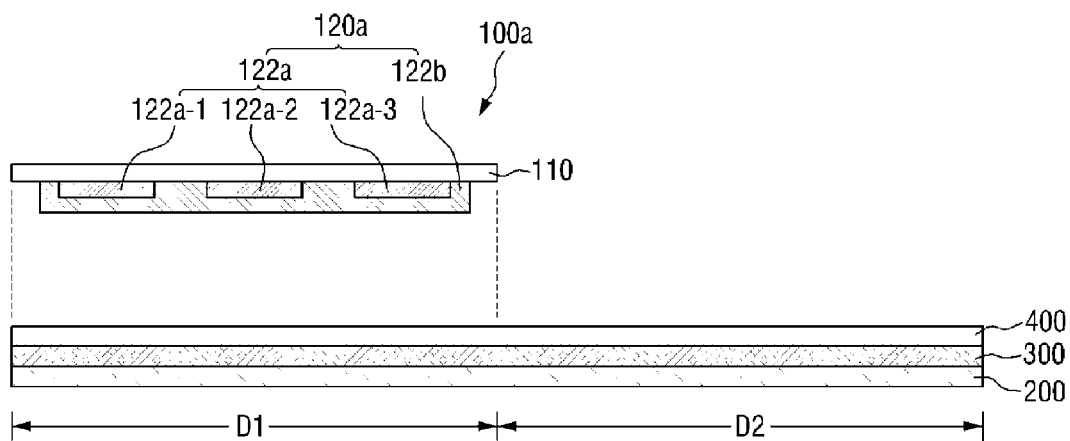

Thereafter, referring to FIG. 12, a photomask 100a may be placed over the resist layer 400. More specifically, the photomask 100a may be placed over a region D1 on the resist layer 400.

The photomask 100a may be substantially identical to the photomask 100a of FIGS. 4 and 5. That is, the photomask 100a may include a glass substrate 110 and a plurality of filter layers 120a, which are disposed on the glass substrate 110. The filter layers 120a may include a first filter layer 122a and a second filter layer 124a, and the first filter layer 122a may include a first sub-filter layer 122a-1, a second sub-filter layer 122a-2 and a third sub-filter layer 122a-3, which are disposed on the glass substrate 110 to be separate from one another. Each of the first, second and third sub-filter layers 122a-1, 122a-2 and 122a-3, which are included in the first filter layer 122a, may selectively transmit first-wavelength light therethrough but block second-wavelength light, and the second filter layer 124a may selectively transmit second-wavelength light therethrough but block first-wavelength light.

Figure 13:
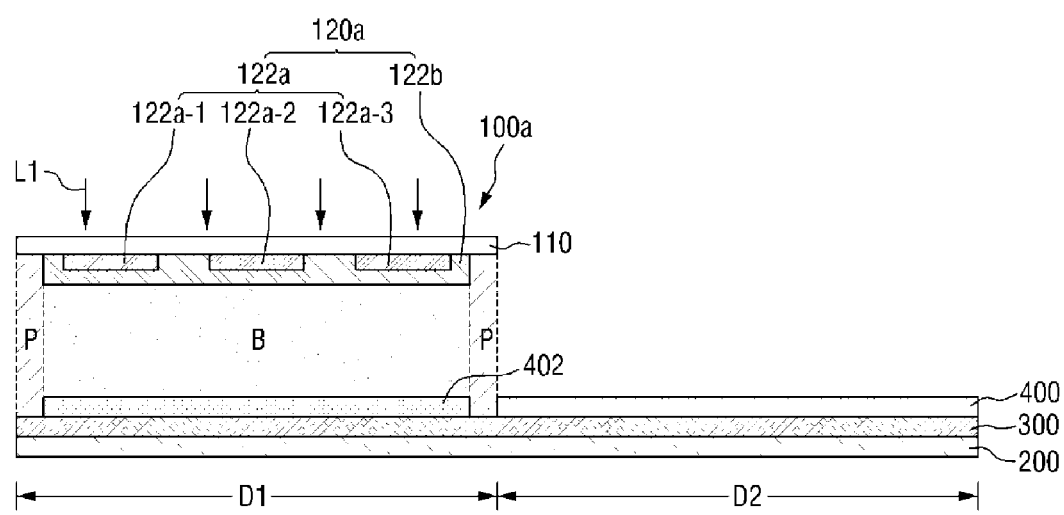

Thereafter, referring to FIG. 13, a resist pattern 402 may be formed in the region D1 of the resist layer 400 by selectively applying first-wavelength light L1 over the region D1 through the photomask 100a with the use of an exposure device (not illustrated) and developing the resist layer 400. The exposure device may selectively generate light of a predetermined wavelength. For example, the exposure device may selectively generate the first-wavelength light L1 or the second-wavelength light.

More specifically, in response to the first-wavelength light L1 being irradiated on the region D1 of the resist layer 400 through the photomask 100a, the first-wavelength light L1 may be selectively transmitted through the photomask 100a and may expose the resist layer 400. That is, there may be provided a light-blocking region B that blocks the transmission of the first-wavelength light L1 therethrough due to the presence of the second filter layer 122b and a light-transmitting region P that allows the first-wavelength light L1 to be transmitted therethrough due to the absence of the second filter layer 122b. The resist pattern 402 may be formed in the region D1 by selectively applying the first-wavelength light L1 to the resist layer 400 through the photomask 100a and developing the resist layer 400.

In the exemplary embodiment of FIGS. 10 to 16, positive photoresist may be used to form the resist layer 400. In an alternative exemplary embodiment, negative photoresist may be used to form the resist layer 400. In this alternative exemplary embodiment, part of the resist layer 400 that is exposed to light may form the resist pattern 402.

Figure 14:
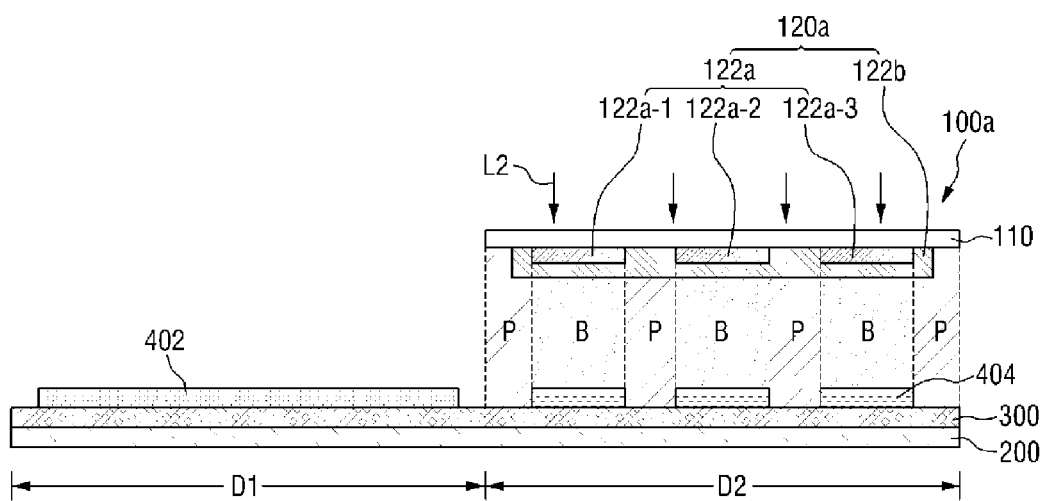

Thereafter, referring to FIG. 14, a resist layer 400 formed in a region D2 is exposed by selectively applying second-wavelength light L2 over the region D2 through the photomask 100a with the use of the exposure device and developing the resist layer 400.

More specifically, in response to the second-wavelength light L2 being applied over the region D2 of the resist layer 400 through the photomask 100a, the second-wavelength light L2 may be selectively transmitted through the photomask 100a and may expose the resist layer 400. That is, there may be provided a light-blocking region B that blocks the transmission of the second-wavelength light L2 therethrough due to the presence of the first, second and third sub-filter layers 122a-1, 122a-2 and 122a-3 and a light-transmitting region P that allows the second-wavelength light L2 to be transmitted therethrough due to the absence of the first, second and third sub-filter layers 122a-1, 122a-2 and 122a-3. The resist pattern 404 may be formed in the region D2 by selectively applying the second-wavelength light L2 to the resist layer 400 through the photomask 100a and developing the resist layer 400.

In the exemplary embodiment of FIGS. 10 to 16, positive photoresist may be used to form the resist layer 400. In an alternative exemplary embodiment, negative photoresist may be used to form the resist layer 400. In this alternative exemplary embodiment, part of the resist layer 400 that is exposed to light may form the resist pattern 404.

In the method of forming a fine pattern, according to an exemplary embodiment of the inventive concept, the number of photomasks required to form a fine pattern may be reduced by forming a plurality of different patterns with the use of a single photomask, i.e., the photomask 100a.

Also, in the method of forming a fine pattern, according to an exemplary embodiment of the inventive concept, the amount of time that it takes to form a fine pattern may be reduced by forming a plurality of different patterns with the use of a single photomask, i.e., the photomask 100a.

Figure 15:
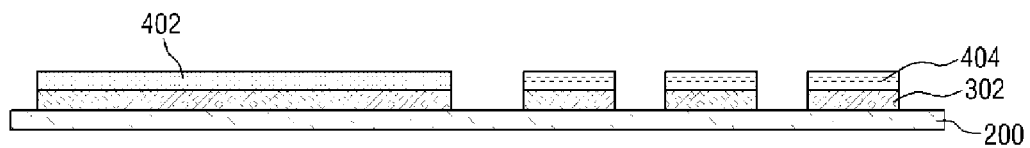

Thereafter, referring to FIG. 15, a fine pattern 302 may be formed by partially etching the layer 300 with the use of the resist patterns 402 and 404. For example, a fine pattern such as wiring, an electrode pattern, an insulating pattern or a contact hole may be formed on the substrate 200. To partially etch the layer 300, wet etching, dry etching or reactive etching may be used, but the inventive concept is not limited thereto.

Figure 16:
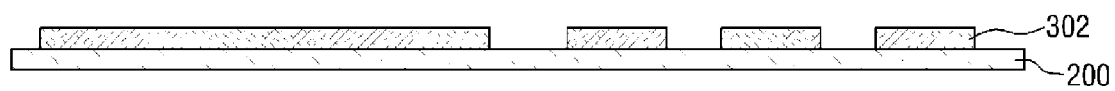

Thereafter, referring to FIG. 16, the resist patterns 402 and 404 may be removed. To remove the resist patterns 402 and 404, ashing, rinsing with the use of sulfuric acid ($H_2SO_4$) and hydrogen peroxide ($H_2O_4$), or an organic stripper may be used, but the inventive concept is not limited thereto.

While the inventive concept has been particularly shown and described with reference to exemplary embodiments thereof, it will be understood by those of ordinary skill in the art that various changes may be made therein without departing from the spirit and scope of the inventive concept as defined by the following claims. The exemplary embodiments should be considered in a descriptive sense only and not for purposes of limitation.

What is claimed is:

1. A photomask, comprising:
a transparent substrate; and
a plurality of filter layers disposed on the transparent substrate,
wherein the filter layers include a first filter layer, which selectively transmits first-wavelength light therethrough, and a second filter layer, which selectively transmits second-wavelength light therethrough and is disposed on the first filter layer, the first-wavelength light and the second-wavelength light have different wavelengths from each other, and
wherein part of the second filter layer overlaps an entire surface of the first filter layer.

2. The photomask of claim 1, wherein the first filter layer has a different shape from the second filter layer.

3. The photomask of claim 1, wherein the first filter layer includes first and second sub-filter layers, which are disposed on the transparent substrate to be separate from each other, and the second filter layer overlaps at least one entire surface of the first or second sub-filter layers.

4. The photomask of claim 3, wherein part of the second filter layer overlaps the entire first sub-filter layer and the entire second sub-filter layer.

5. The photomask of claim 3, wherein the second filter layer includes third and fourth sub-filter layers, which are disposed on the transparent substrate to be separate from each other, the third sub-filter layer overlaps at least one entire surface of the first or second sub-filter layers and the fourth sub-filter layer overlaps at least one entire surface of the first or second sub-filter layers.

6. The photomask of claim 3, wherein the first and second sub-filter layers have the same shape.

7. The photomask of claim 3, wherein the second filter layer has a different shape from at least one of the first or second sub-filter layers.

8. A method of forming a fine pattern, the method comprising:
forming a resist layer by applying photoresist onto a first substrate;
placing a photomask over the resist layer; and
forming a resist pattern by exposing the resist layer to light through the photomask with the use of an exposure device, which generates light of a predetermined wavelength, and developing the resist layer,
wherein the photomask includes a second substrate and a plurality of filter layers disposed on the second substrate, the filter layers include a first filter layer, which selectively transmits first-wavelength light therethrough, and a second filter layer, which selectively transmits second-wavelength light therethrough and is disposed on the first filter layer, the first-wavelength light and the second-wavelength light have different wavelengths from each other, and part of the second filter layer overlaps an entire surface of the first filter layer.

9. The method of claim 8, wherein the forming the resist pattern, comprises:
allowing the exposure device to generate the first-wavelength light and exposing the resist layer to the generated first-wavelength light through the photomask; and
allowing the exposure device to generate the second-wavelength light and exposing the resist layer to the generated second-wavelength light through the photomask.

10. The method of claim 8, further comprising, before the forming the resist layer:
forming a layer to be etched on the first substrate,
wherein the resist layer is formed on the layer to be etched.

11. The method of claim 10, further comprising:
forming a fine pattern by partially etching the layer to be etched with the use of the resist pattern.

12. The method of claim 11, further comprising:
removing the resist pattern.

13. The method of claim 8, wherein the first filter layer has a different shape from the second filter layer.

14. The method of claim 8, wherein the first filter layer includes first and second sub-filter layers, which are disposed on the second substrate to be separate from each other, and the second filter layer overlaps at least one of the first or second sub-filter layers.

15. The method of claim 14, wherein part of the second filter layer overlaps an entire surface of the first sub-filter layer and an entire surface of the second sub-filter layer.

16. The method of claim 14, wherein the first and second sub-filter layers have the same shape.

17. The method of claim 14, wherein the second filter layer has a different shape from at least one of the first or second sub-filter layers.

18. The method of claim 13, wherein the second filter layer includes third and fourth sub-filter layers, which are disposed on the second substrate to be separate from each other, the third sub-filter layer overlaps at least one of the first or second sub-filter layers and the fourth sub-filter layer overlaps at least one of the first or second sub-filter layers.

* * * * *